United States Patent
Hu et al.

(10) Patent No.: US 8,945,991 B2
(45) Date of Patent: *Feb. 3, 2015

(54) FABRICATING A WAFER LEVEL SEMICONDUCTOR PACKAGE HAVING A PRE-FORMED DIELECTRIC LAYER

(71) Applicant: Broadcom Corporation, Irvine, CA (US)

(72) Inventors: Kevin (Kunzhong) Hu, Irvine, CA (US); Chonghua Zhong, Irvine, CA (US); Edward Law, Ladera Ranch, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/087,445

(22) Filed: Nov. 22, 2013

(65) Prior Publication Data

US 2014/0087553 A1 Mar. 27, 2014

Related U.S. Application Data

(63) Continuation of application No. 13/306,787, filed on Nov. 29, 2011, now Pat. No. 8,592,259.

(51) Int. Cl.
*H01L 21/50* (2006.01)

(52) U.S. Cl.
USPC .... 438/118; 438/121; 438/124; 438/E23.141; 257/685; 257/774

(58) Field of Classification Search
USPC ............ 257/681–685, 692, 700, 774; 438/51, 438/106, 109–110, 113, 212
See application file for complete search history.

(56) References Cited

U.S. PATENT DOCUMENTS

2011/0140808 A1* 6/2011 Kurahashi et al. ............ 333/193
2012/0313240 A1* 12/2012 Cheng et al. .................. 257/737

* cited by examiner

*Primary Examiner* — Dung A. Le
(74) *Attorney, Agent, or Firm* — Oblon, Spivak, McClelland, Maier & Neustadt, L.L.P.

(57) ABSTRACT

There are disclosed herein various implementations of improved wafer level semiconductor packages. One exemplary implementation comprises forming a post-fabrication redistribution layer (post-Fab RDL) between first and second dielectric layers affixed over a surface of a wafer, and forming a window for receiving an electrical contact body in the second dielectric layer, the window exposing the post-Fab RDL. At least one of the first and second dielectric layers is a pre-formed dielectric layer, which may be affixed over the surface of the wafer using a lamination process. In one implementation, the window is formed using a direct laser ablation process.

25 Claims, 6 Drawing Sheets

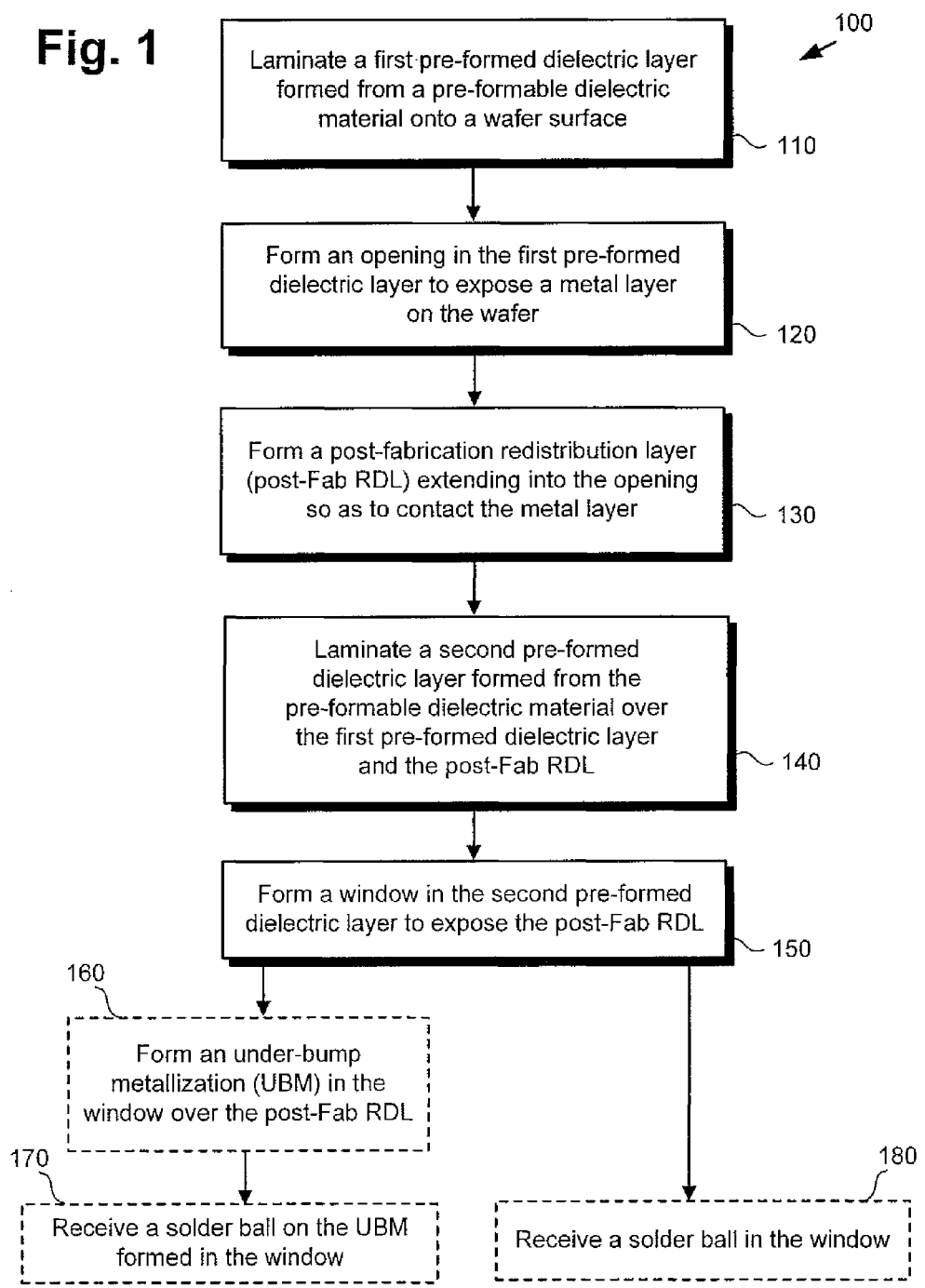

FABRICATING A WAFER LEVEL SEMICONDUCTOR PACKAGE HAVING A PRE-FORMED DIELECTRIC LAYER

This is a continuation of application Ser. No. 13/306,787 filed Nov. 29, 2011.

BACKGROUND

Many popular electronic devices, such as mobile telephones and other mobile communication devices, rely on integrated circuits (ICs) for their operation. As those electronic devices become ever more sophisticated while often concurrently being reduced in size, IC density and packaging become increasingly important design constraints. In response, newer packaging solutions have been developed. One packaging solution uses a wafer level packaging technique in which deposition of surface passivation layers, formation of post-fabrication redistribution layers, and solder bumping, for example, are performed on a processed wafer, prior to singulation of the wafer.

In a conventional wafer level packaging process, each surface passivation layer is typically applied using a spin coating process. Lithographic masks are usually then employed to pattern the passivation layers for formation of the post-fabrication redistribution layers, as well as for any desired under-bump metallization. As a result, the conventional process is time consuming, expensive, and often includes several chemical processing steps in which reagents capable of causing significant environmental harm are utilized.

SUMMARY

The present disclosure is directed to a wafer level semiconductor package, substantially as shown in and/or described in connection with at least one of the figures, and as set forth more completely in the claims.

BRIEF DESCRIPTION OF THE DRAWINGS

FIG. 1 shows a flowchart presenting an exemplary method for producing an improved wafer level semiconductor package.

DETAILED DESCRIPTION

Figure 2A:
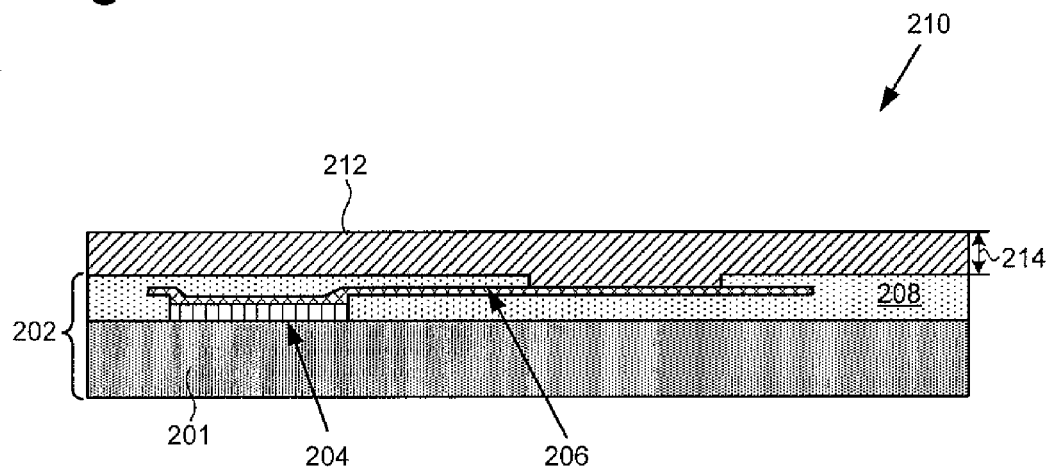
FIG. 2A shows a cross-sectional view, which includes a portion of a wafer processed according to an initial stage of the flowchart in FIG. 1.

The following description contains specific information pertaining to implementations in the present disclosure. One skilled in the art will recognize that the present disclosure may be implemented in a manner different from that specifically discussed herein. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

FIG. 1 shows flowchart 100 presenting an exemplary method for producing an improved wafer level semiconductor package. It is noted that the method described by flowchart 100 is performed on a portion of a processed semiconductor wafer, which may include, among other features, a substrate, a device layer, metal layers providing electrical routing, and a surface passivation layer, such as a silicon nitride ($Si_3N_4$) passivation, for example.

With respect to FIGS. 2A through 2H, structures 210 through 280 shown respectively in those figures illustrate the result of performing the method of flowchart 100 on a semiconductor wafer. For example, structure 210 shows a portion of the wafer after lamination of a first pre-formed dielectric layer onto the wafer surface (110), structure 220 shows structure 210 after an opening is formed in the first pre-formed dielectric layer to expose a metal layer on the wafer (120), structure 230 shows structure 220 after formation of a post-fabrication redistribution layer (post-Fab RDL) extending into the opening to contact the metal layer (130), and so forth. It is noted that although FIGS. 2A through 2H depict formation of structures including two pre-formed dielectric layers and one post-Fab RDL, other implementations using the present concepts may include more than two pre-formed dielectric layers and more than one post-Fab RDL.

Referring to FIG. 2A, structure 210 in FIG. 2A shows a portion of wafer 202 processed according to an initial stage of flowchart 100, in FIG. 1. As shown in FIG. 2A, wafer 202 includes metal layer 204, which may be a portion of a top metal layer of wafer 202, and surface passivation layer 208, formed over semiconductor body 201. As further shown in FIG. 2A, according to the example implementation represented by structure 210, wafer 202 also includes a redistribution layer (RDL) provided during fabrication of wafer 202 and serving as another metal layer of wafer 202 (e.g., in-Fab RDL 206). Also shown in FIG. 2A is pre-formed dielectric layer 212 affixed to the surface of wafer 202 and having substantially uniform thickness 214.

Semiconductor body 201 may include a substrate, such as a silicon or other group IV semiconductor substrate, for example, and a device layer, such as an epitaxial silicon layer in which active devices have been fabricated (substrate and device layers are not shown as such in FIGS. 2A through 2H). Metal layer 204 may be formed from copper (Cu), for example, through patterning of a top metallization layer of wafer 202 during a back-end-of-line (BEOL) process. In-Fab RDL 206 may be formed of aluminum (Al), for example, or may be formed of a metal alloy, such as a tri-metal alloy including Cu, nickel (Ni), and titanium (Ti), for example. As mentioned above, surface passivation layer 208 may be a nitride layer, such as a $Si_3N_4$ layer, for example, formed using a chemical vapor deposition process (CVD), or any other suitable process for providing surface passivation layer 208.

Continuing to refer to FIG. 2A with further reference to flowchart 100, in FIG. 1, flowchart 100 begins with lamination of pre-formed dielectric layer 212 onto a surface of wafer 202 (110). Pre-formed dielectric layer 212 may be cut or patterned from a pre-formable dielectric material, such as an epoxy-phenolic or cyanate ester-epoxy build-up material, for example. As a specific example, in one implementation, pre-formed dielectric layer 212 may be produced by pre-forming a layer of Ajinomoto™ Build-up Film (ABF) and laminating the pre-formed ABF layer to wafer 202.

In contrast to the process described by reference to flowchart 100 and FIG. 2A, conventional approaches to achieving wafer level packaging typically apply a post-fabrication passivation layer analogous to pre-formed dielectric layer 212 using a spin coating process to form a passivation layer from a polymer dielectric such as polyimide or polybenzoxazole (PBO), for example. That conventional approach entails several disadvantages that are substantially reduced or entirely avoided through implementation of the wafer level packaging solution disclosed herein. For example, by using pre-formed dielectric layer 212 and affixing pre-formed dielectric layer 212 to wafer 202 through a lamination process, the present solution is capable of completing, in one or a very few hours, what the conventional approach may require a week or more to accomplish. In addition, lamination of pre-formed dielectric layer 212 onto wafer 202 avoids the relatively costly and chemical reagent intensive processing inherent to spin coating, such as the baking, development, etching, and cleaning typically included in spin coat processing, for example.

Moreover, the present solution advantageously enables use of pre-formed dielectric layer 212 having substantially uniform thickness 214 significantly greater than the passivation layer thicknesses achievable using the conventional approach. For example, conventional spin coating processes may encounter difficulty in producing uniform passivation layers having thicknesses greater than approximately five microns (5 μm), and are typically unable to produce uniform passivation layers having thicknesses of greater than approximately eight to ten microns (8-10 μm). By contrast, pre-formed dielectric layer 212 can be produced to have virtually any desired substantially uniform thickness 214. As a result, pre-formed dielectric layer 212 may be a relatively thick dielectric layer having substantially uniform thickness 214 greater than 8 μm, or greater than 10 μm, for example.

Figure 2B:
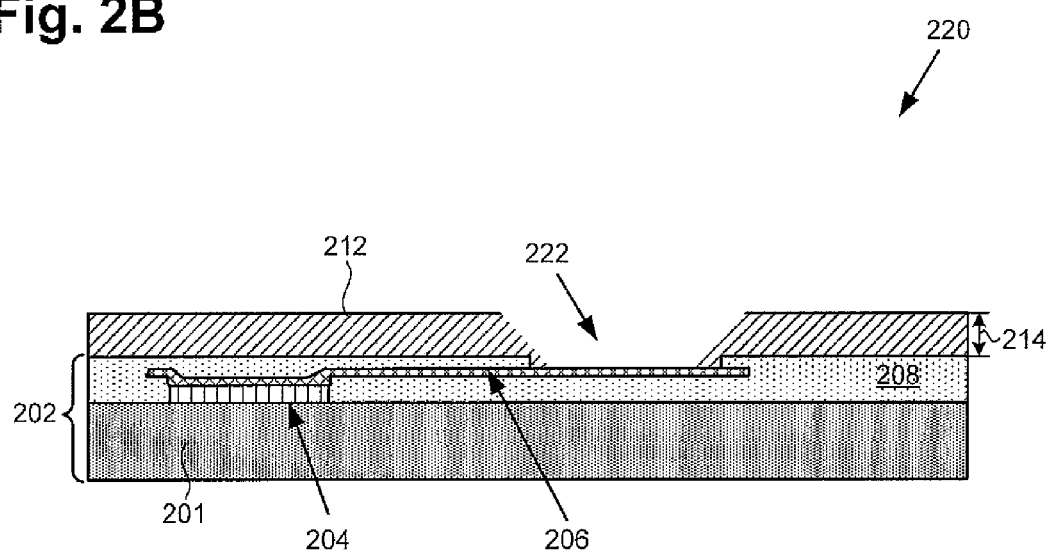
FIG. 2B shows a cross-sectional view, which includes a portion of a wafer processed according to an intermediate stage of the flowchart in FIG. 1.

Referring now to structure 220, in FIG. 2B, in combination with FIG. 1, flowchart 100 continues with formation of opening 222 in pre-formed dielectric layer 212 so as to expose a metal layer on wafer 202 (120). As shown in FIG. 2B, according to one implementation, opening 222 may be formed so as to expose in-Fab RDL 206. Alternatively, in implementations in which optional in-Fab RDL 206 is omitted, opening 222 may be formed so as to expose metal layer 204 of wafer 202.

Opening 222 may be formed using a direct laser ablation process, for example, also sometimes referred to as laser drilling. Use of a laser drill to form opening 222 by direct laser ablation provides significant advantages over conventional wafer level packaging techniques for patterning a post fabrication passivation layer analogous to pre-formed dielectric layer 212. For example, conventional wafer level packaging approaches include lithographic patterning of a post fabrication passivation layer analogous to pre-formed dielectric layer 212, and typically require masking and development of a photoresist for formation of opening 222, which may be costly and time consuming processes that can be avoided through use of direct laser ablation, as disclosed herein. In addition, a laser drill may be readily programmed to quickly form an opening having almost any shape at substantially any location on pre-formed dielectric layer 212, thereby enabling significant design flexibility. It is noted, however, that in implementations in which a patterning technique other than direct laser ablation is otherwise advantageous or desirable, opening 222 may be formed using any suitable technique known in the art, including lithographic patterning.

Figure 2C:
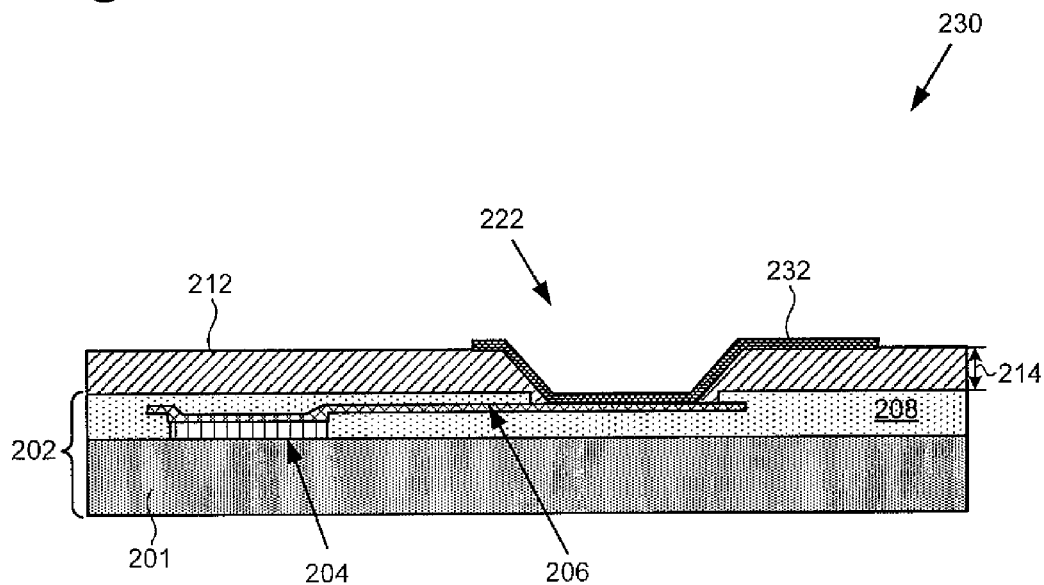
FIG. 2C shows a cross-sectional view, which includes a portion of a wafer processed according to an intermediate stage of the flowchart in FIG. 1.

Moving to structure 230 in FIG. 2C with ongoing reference to FIG. 1, flowchart 100 continues with formation of post-Fab RDL 232 extending into opening 222 so as to contact in-Fab RDL 206 (130). Post-Fab RDL 232 may be formed of Cu, for example, or may be a metal alloy, such as a tri-metal alloy including Cu, Ni, and Ti, for example. Post-Fab RDL 232 may be formed using any suitable technique, such as electrochemical deposition or an electrolytic plating process, for example. As mentioned above, in some implementations, optional in-Fab RDL 206 may be omitted. In those implementations, post-Fab RDL 232 may be formed in an opening exposing metal layer 204 so as to extend into the opening and make electrical contact with metal layer 204.

Figure 2D:
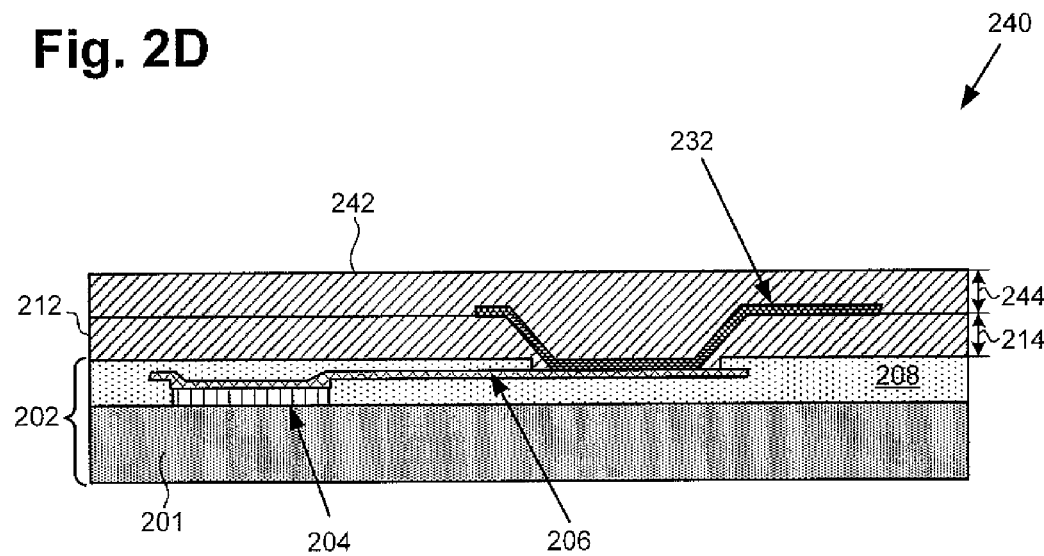
FIG. 2D shows a cross-sectional view, which includes a portion of a wafer processed according to an intermediate stage of the flowchart in FIG. 1.

As shown by structure 240 in FIG. 2D, flowchart 100 continues with lamination of pre-formed dielectric layer 242 over pre-formed dielectric layer 212 and post-Fab RDL 232 (140). Pre-formed dielectric layer 242 has substantially uniform thickness 244, and, as is the case for pre-formed dielectric layer 212, may be cut or patterned from a pre-formable dielectric material, such as a packaging substrate build-up material. For example, in one implementation, pre-formed dielectric layer 242 may be formed of ABF. It is noted that although the present example implementation characterizes both of dielectric layers 212 and 242 as pre-formed dielectric layers affixed over wafer 202 using a lamination process, in some implementations one of dielectric layers 212 and 242 may be a pre-formed dielectric layer affixed through lamination, while the other dielectric layer may be formed using a conventional process, such as a spin coating process, for example. Thus, according to the present concepts, post-Fab RDL 232 is formed between dielectric layers 212 and 242 formed over the surface of wafer 202, and at least one of dielectric layers 212 and 242 is a pre-formed dielectric layer.

There may be distinct advantages to implementing both of dielectric layers 212 and 242 as pre-formed dielectric layers affixed using lamination, as represented by the present figures. For example, as discussed above, formation and lamination of pre-formed dielectric layer 212 may be completed in as little as approximately one hour, while formation of an analogous conventional passivation layer using a spin coating process may take a week or more to accomplish. Thus, implementation of both of dielectric layers 212 and 242 as pre-formed dielectric layers affixed over wafer 202 through lamination enables production, within a few hours, of a wafer level packaging structure otherwise requiring two to three weeks for completion using conventional wafer level packaging techniques. In addition, pre-formed dielectric layer 242 is capable of having substantially uniform thickness 244 significantly greater than may be achieved using the conventional spin coating approach. As a result, pre-formed dielectric layer 242 may be a relatively thick dielectric layer having substantially uniform thickness 244 greater than 8 μm, or greater than 10 μm, for example.

Figure 2E:
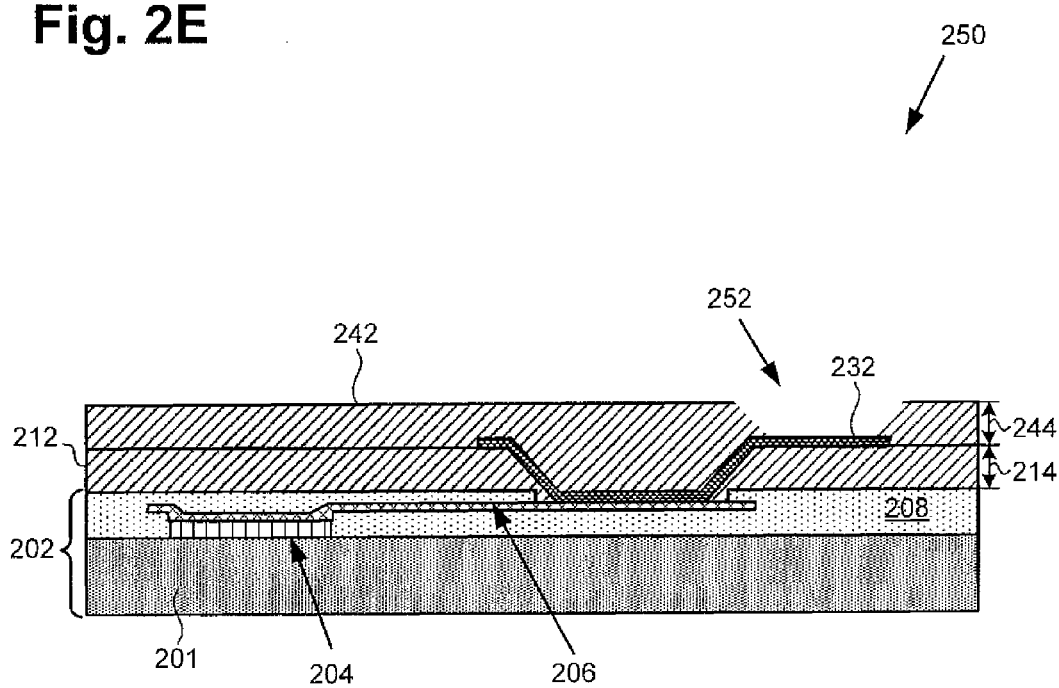
FIG. 2E shows a cross-sectional view, which includes a portion of a wafer processed according to an intermediate stage of the flowchart in FIG. 1.

Referring now to structure 250 in FIG. 2E, in combination with FIG. 1, flowchart 100 continues with formation of window 252 in pre-formed dielectric layer 242 to expose post-Fab RDL 232 (150). Window 252 may be provided for the purpose of receiving an electrical contact body in pre-formed dielectric layer 242, such as a solder ball or solder bump, for example (electrical contact body not shown in FIG. 2E).

According to one implementation, window 252 may be formed using a direct laser ablation process.

As noted above, use of a laser drill to perform direct laser ablation can provide significant advantages over conventional wafer level packaging techniques for patterning a post fabrication passivation layer analogous to pre-formed dielectric layer 242. For example, conventional wafer level packaging approaches include lithographic patterning of a post fabrication passivation layer analogous to pre-formed dielectric layer 242, and typically require masking and development of a photoresist for formation of window 252. Moreover, a laser drill may be programmed to quickly form a window having almost any shape and with almost any edge profile, at substantially any location on pre-formed dielectric layer 242. However, in implementations in which a patterning technique other than direct laser ablation is deemed advantageous or desirable, window 252 may be formed using any suitable technique known in the art.

Figure 2F:
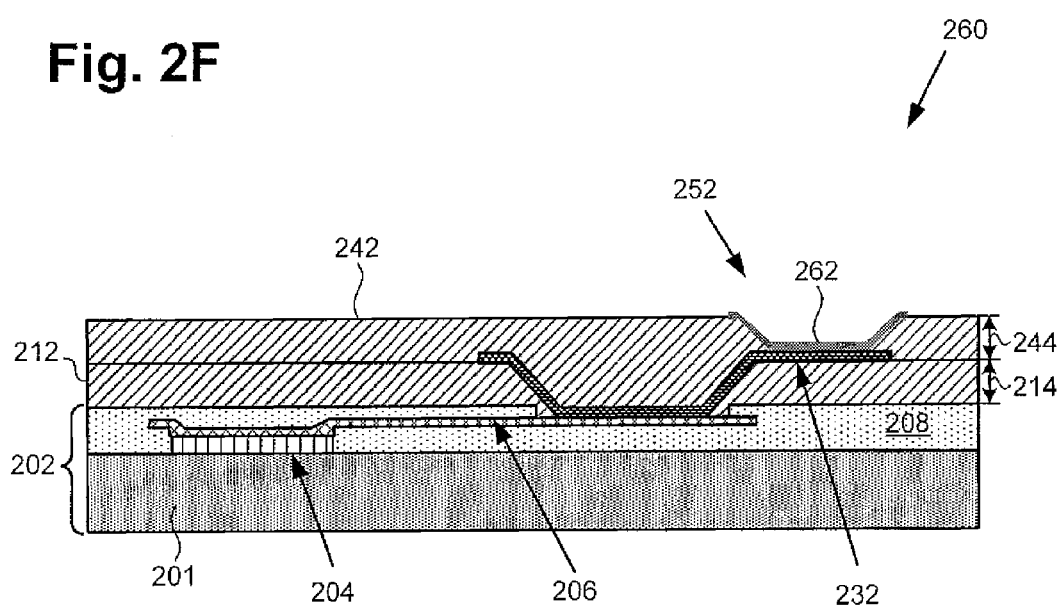
FIG. 2F shows a cross-sectional view, which includes a portion of a wafer processed according to an intermediate stage of the flowchart in FIG. 1.

Referring to FIG. 1, according to one implementation, flowchart 100 continues with formation of an under-bump metallization (UBM) in window 252 over post-Fab RDL 232 (160), as shown by UBM 262 of structure 260 in FIG. 2F. UBM 262 may be provided to facilitate electrical coupling of post-Fab RDL 232 and an electrical contact body subsequently received in window 252 (electrical contact body not shown in FIG. 2F). UBM 262 may be formed from a metal, metal alloy, multi-metal or multi-alloy stack, such as a multi-alloy stack including a combination of Cu, Ni, Ti, tungsten (W), vanadium (V), chromium (Cr), and gold (Au), for example. UBM 262 may be formed using an electrochemical deposition processes, for example, or any other suitable technique, as known in the art.

Figure 2G:
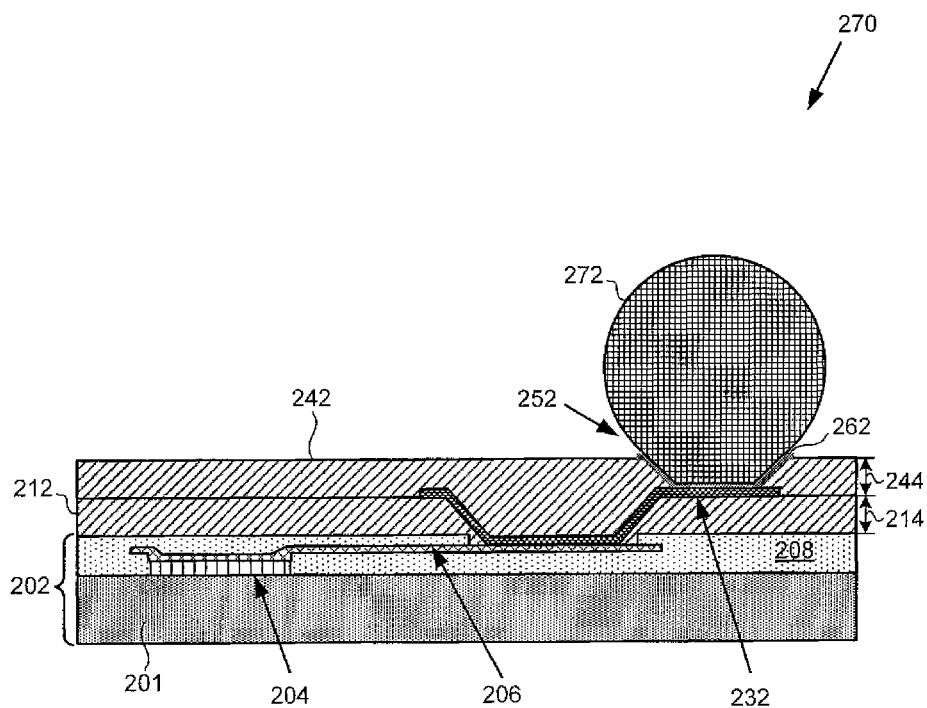
FIG. 2G shows a cross-sectional view, which includes a portion of an improved wafer level semiconductor package according to one implementation.

Continuing with the implementation shown by structure 270 in FIG. 2G, flowchart 100 may conclude when solder ball 272 is received on UBM 262 formed in window 252 (170). It is noted that, more generally, solder ball 272 may correspond to any electrical contact body suitable for use to provide an external electrical connection for post-Fab RDL 232. Thus, in other implementations, solder ball 272 may correspond to a solder bump, such as a microbump, or a metal post or pillar, for example. Solder ball 272 may be placed onto UBM 262 and reflowed to form a stable electrical connection to post-Fab RDL 232 using any conventional techniques utilized in the art.

Figure 2H:
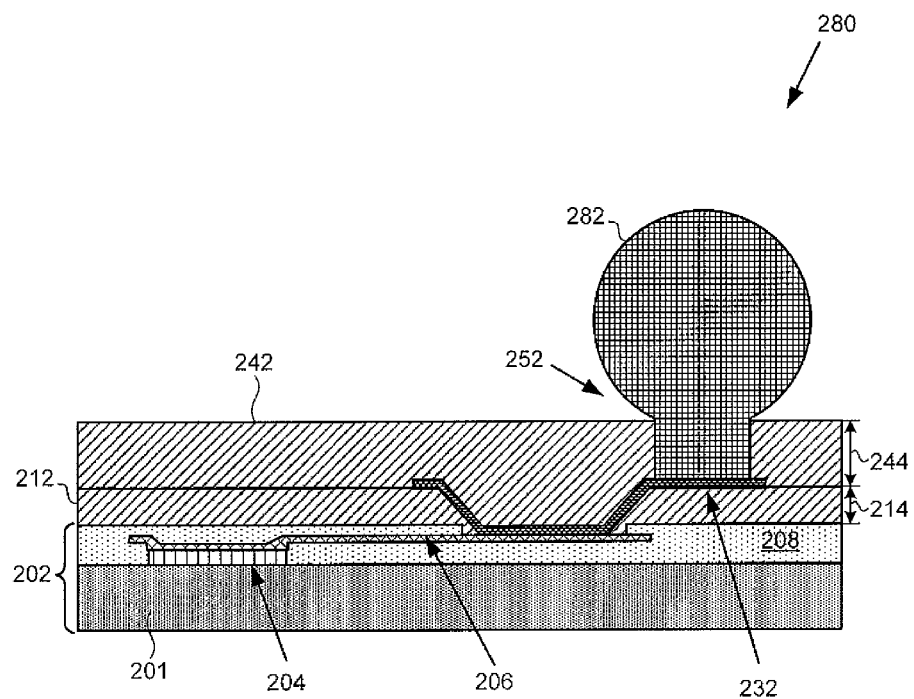
FIG. 2H shows a cross-sectional view, which includes a portion of an improved wafer level semiconductor package according to another implementation.

Turning now to FIG. 2H, structure 280 shows a cross-sectional view of a portion of an improved wafer level semiconductor package according to another implementation. According to the implementation shown in FIG. 2H, the method described by flowchart 100 may omit the optional formation of UBM 262 (160) shown by structure 260, in FIG. 2F, and may conclude instead when solder ball 282 is received into window 252 (180). As shown in FIG. 2H, according to the present implementation, substantially uniform thickness 244 of pre-formed dielectric layer 242 may be greater than substantially uniform thickness 214 of pre-formed dielectric layer 212. As noted above, one advantage of using a pre-formable dielectric material to form pre-formed dielectric layers 212 and/or 242 is the range of possible dielectric layer thicknesses thereby enabled.

Thus, depending on the desired implementation, pre-formed dielectric layer 212 may be formed to be slightly, or substantially, thicker or thinner than pre-formed dielectric layer 242, or may have substantially the same thickness, for example. Consequently, as shown in FIG. 2H, in some implementations, pre-formed dielectric layer 242 and window 252 can be configured to receive solder ball 282 more deeply into the packaging surface provided by pre-formed dielectric layer 242 so as to electrically couple solder ball 282 to post-Fab RDL 232.

Thus, by using a pre-formed dielectric layer and affixing the pre-formed dielectric layer to a wafer surface through a lamination process, various implementations of the concepts disclosed herein advantageously enable significantly faster production of improved wafer level semiconductor packages relative to the conventional art, while concurrently reducing the use of environmentally harmful chemical reagents. In addition, the disclosed implementations advantageously enable use of pre-formed dielectric layers having substantially more uniform thicknesses than may be achieved using a conventional spin coating process. Consequently, the concepts and implementations disclosed herein provide a faster, less costly, and environmentally cleaner packaging solutions, and result in an improved wafer level semiconductor package.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the spirit and the scope of those concepts. As such, the described implementations are to be considered in all respects as illustrative and not restrictive. It should also be understood that the present application is not limited to the particular implementations described herein, but many rearrangements, modifications, and substitutions are possible without departing from the scope of the present disclosure.

The invention claimed is:

1. A method for producing a wafer level semiconductor package, said method comprising:
    forming a post-fabrication redistribution layer (post-Fab RDL) between first and second dielectric layers affixed over a surface of a wafer, said first dielectric layer being a pre-formed dielectric layer between said wafer and said second dielectric layer,
    wherein said pre-formed dielectric layer comprises a build-up material.

2. The method at claim 1, wherein said pre-formed dielectric layer comprises an Ajinomoto™ Build-up Film (ABF).

3. The method of claim 1, further comprising forming a window for receiving an electrical contact body in said second dielectric layer.

4. The method of claim 1, wherein said pre-formed dielectric layer is affixed using a lamination process.

5. The method of claim 3, wherein said window is formed using a direct laser ablation process.

6. The method of claim 3, further comprising forming an under-bump metallization (UBM) in said window prior to receiving said electrical contact body.

7. The method of claim 3, further comprising receiving said electrical contact body in said window so as to electrically couple said electrical contact body to said post-Fab RDL.

8. The method of claim 3, wherein said electrical contact body is a solder ball.

9. A method for producing a wafer level semiconductor package, said method comprising:
    forming a post-fabrication redistribution layer (post-Fab RDL) between a first pre-formed dielectric layer and a second pre-formed dielectric layer affixed over a surface of a wafer,
    wherein at least one of said first pre-formed dielectric layer and said second pre-formed dielectric layer comprises an Ajinomoto™ Build-up Film (ABF).

10. The method of claim 9, further comprising forming, a window for receiving an electrical contact body in said second pre-formed dielectric layer.

11. The method of claim 9, wherein said first pre-formed dielectric layer is affixed using a lamination process.

12. The method of claim 9, wherein said second pre-formed dielectric layer is affixed using a lamination process.

13. The method of claim 10, wherein said window is formed using a direct laser ablation process.

14. The method of claim 10, further comprising forming an under-hump metallization (UBM) in said window prior to receiving said electrical contact body.

15. The method of claim 10, wherein said electrical contact body is a solder ball.

16. A method for producing a wafer level semiconductor package, said method comprising:
    forming a post-fabrication redistribution layer (post-Fab RDL) between first and second dielectric layers affixed over a surface of a wafer, said first dielectric layer being a pre-formed dielectric layer between said wafer and said second dielectric layer; and
    forming an under-bump metallization (UBM), wherein a shape of the UBM is substantially similar to a shape of the post-Fab RDL.

17. The method of claim 16, wherein said pre-formed dielectric layer comprises an Ajinomoto™ Build-up Film (ABF).

18. The method of claim 16, further comprising forming a window for receiving an electrical contact body in said second dielectric layer, said window exposing said post-Fab RDL.

19. The method of claim 18, further comprising electrically coupling said electrical contact body to said post-Fab RDL.

20. The method of claim 16, wherein said pre-formed dielectric layer is affixed using a lamination process.

21. The method of claim 1, further comprising:
    disposing the post-Fab RDL within the first dielectric layer and the second dielectric layer.

22. The method of claim 9, further comprising:
    disposing the post-Fab RDL within the first dielectric layer and the second dielectric layer.

23. The method of claim 16, further comprising:
    disposing the post-Fab RDL within the first dielectric layer and the second dielectric layer.

24. The method of claim 6, wherein a shape of the UBM is substantially similar to a shape of the post-Fab RDL.

25. The method of claim 14, wherein a shape of the UBM is substantially similar to a shape of the post-Fab RDL.

* * * * *